United States Patent
Wu et al.

(10) Patent No.: US 11,929,328 B2
(45) Date of Patent: *Mar. 12, 2024

(54) CONDUCTIVE CONTACT HAVING BARRIER LAYERS WITH DIFFERENT DEPTHS

(71) Applicant: Taiwan Semiconductor Manufacturing Co., Ltd., Hsin-Chu (TW)

(72) Inventors: Chia-Yang Wu, Tainan (TW); Shiu-Ko JangJian, Tainan (TW); Ting-Chun Wang, Tainan (TW); Yung-Si Yu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 314 days.

This patent is subject to a terminal disclaimer.

(21) Appl. No.: 17/140,654

(22) Filed: Jan. 4, 2021

(65) Prior Publication Data

US 2021/0125935 A1    Apr. 29, 2021

Related U.S. Application Data

(63) Continuation of application No. 16/050,191, filed on Jul. 31, 2018, now Pat. No. 10,886,226.

(51) Int. Cl.
*H01L 23/532* (2006.01)
*H01L 21/311* (2006.01)
(Continued)

(52) U.S. Cl.
CPC .. *H01L 23/53266* (2013.01); *H01L 21/32135* (2013.01); *H01L 21/76804* (2013.01);
(Continued)

(58) Field of Classification Search
CPC ......... H01L 21/32135; H01L 21/76804; H01L 21/76846; H01L 21/76847;
(Continued)

(56) References Cited

U.S. PATENT DOCUMENTS 5,940,731 A     8/1999   Wu
5,998,873 A * 12/1999   Blair ..................... H01L 23/485
                                                         257/766
(Continued)

FOREIGN PATENT DOCUMENTS

CN     106887463 A    6/2017
JP      H 1186225 A    7/1999
(Continued)

*Primary Examiner* — Dale E Page
*Assistant Examiner* — Quovaunda Jefferson
(74) *Attorney, Agent, or Firm* — HAYNES AND BOONE, LLP

(57) ABSTRACT

A semiconductor device includes a transistor having a source/drain and a gate. The semiconductor device also includes a conductive contact for the transistor. The conductive contact provides electrical connectivity to the source/drain or the gate of the transistor. The conductive contact includes a plurality of barrier layers. The barrier layers have different depths from one another.

20 Claims, 16 Drawing Sheets

(51) Int. Cl.
*H01L 21/3213* (2006.01)
*H01L 21/768* (2006.01)
*H01L 29/417* (2006.01)

(52) U.S. Cl.
CPC .. *H01L 21/76846* (2013.01); *H01L 21/76847* (2013.01); *H01L 21/76865* (2013.01); *H01L 29/41725* (2013.01); *H01L 21/31111* (2013.01); *H01L 21/31116* (2013.01)

(58) Field of Classification Search
CPC ......... H01L 21/76865; H01L 23/53266; H01L 23/485; H01L 23/5226; H01L 21/766865; H01L 21/31111; H01L 21/31116; H01L 21/28518; H01L 21/76855; H01L 21/76844; H01L 21/31105; H01L 21/823431; H01L 29/41725; H01L 29/41791; H01L 29/785; H01L 29/66795; H01L 29/7843; H01L 29/7848; H01L 2029/7858
See application file for complete search history.

(56) References Cited

U.S. PATENT DOCUMENTS

| | | | |
|---|---|---|---|
| 6,048,792 A * | 4/2000 | Watanabe | H01L 21/76846 |
| | | | 257/E21.585 |
| 7,425,740 B2 | 9/2008 | Liu et al. | |
| 7,667,271 B2 | 2/2010 | Yu et al. | |
| 7,910,453 B2 | 3/2011 | Xu et al. | |
| 8,048,723 B2 | 11/2011 | Chang et al. | |
| 8,053,299 B2 | 11/2011 | Xu | |
| 8,183,627 B2 | 5/2012 | Currie | |
| 8,362,575 B2 | 1/2013 | Kwok et al. | |
| 8,367,498 B2 | 2/2013 | Chang et al. | |
| 8,377,779 B1 | 2/2013 | Wang | |
| 8,399,931 B2 | 3/2013 | Liaw et al. | |
| 8,415,718 B2 | 4/2013 | Xu | |
| 8,440,517 B2 | 5/2013 | Lin et al. | |
| 8,487,378 B2 | 7/2013 | Goto et al. | |
| 8,497,177 B1 | 7/2013 | Chang et al. | |
| 8,497,528 B2 | 7/2013 | Lee et al. | |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,652,894 B2 | 2/2014 | Lin et al. | |
| 8,680,576 B2 | 3/2014 | Ching et al. | |
| 8,686,516 B2 | 4/2014 | Chen et al. | |
| 8,703,565 B2 | 4/2014 | Chang et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 * | 5/2014 | Lee | H01L 23/50 |
| | | | 257/773 |
| 8,742,509 B2 | 6/2014 | Lee et al. | |
| 8,772,109 B2 | 7/2014 | Colinge | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,826,213 B1 | 9/2014 | Ho et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,887,106 B2 | 11/2014 | Ho et al. | |
| 9,105,490 B2 | 8/2015 | Wang et al. | |
| 10,886,226 B2 * | 1/2021 | Wu | H01L 21/32135 |
| 2003/0042550 A1 | 3/2003 | Derraa et al. | |
| 2005/0173239 A1 | 8/2005 | Somekh et al. | |
| 2006/0081986 A1 * | 4/2006 | Clevenger | H01L 21/76802 |
| | | | 257/E23.145 |
| 2011/0068407 A1 | 3/2011 | Yeh et al. | |
| 2013/0011983 A1 | 1/2013 | Tsai et al. | |
| 2013/0285153 A1 | 10/2013 | Lee et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0183600 A1 | 7/2014 | Huang et al. | |
| 2014/0252412 A1 | 9/2014 | Tsai et al. | |
| 2014/0264590 A1 | 9/2014 | Yu et al. | |
| 2014/0264592 A1 | 9/2014 | Oxland et al. | |
| 2014/0282326 A1 | 9/2014 | Chen et al. | |
| 2015/0263003 A1 | 9/2015 | Lee et al. | |
| 2015/0341029 A1 | 11/2015 | Franchn et al. | |
| 2015/0380305 A1 | 12/2015 | Basker et al. | |
| 2016/0093566 A1 * | 3/2016 | Ting | H01L 21/76808 |
| | | | 438/643 |

FOREIGN PATENT DOCUMENTS

| | | |
|---|---|---|
| KR | 20040001878 | 1/2004 |
| KR | 20100109920 A | 10/2010 |
| TW | 200937583 A | 9/2009 |
| TW | 201423908 A | 6/2014 |
| WO | WO 2009073773 A1 | 6/2009 |

* cited by examiner

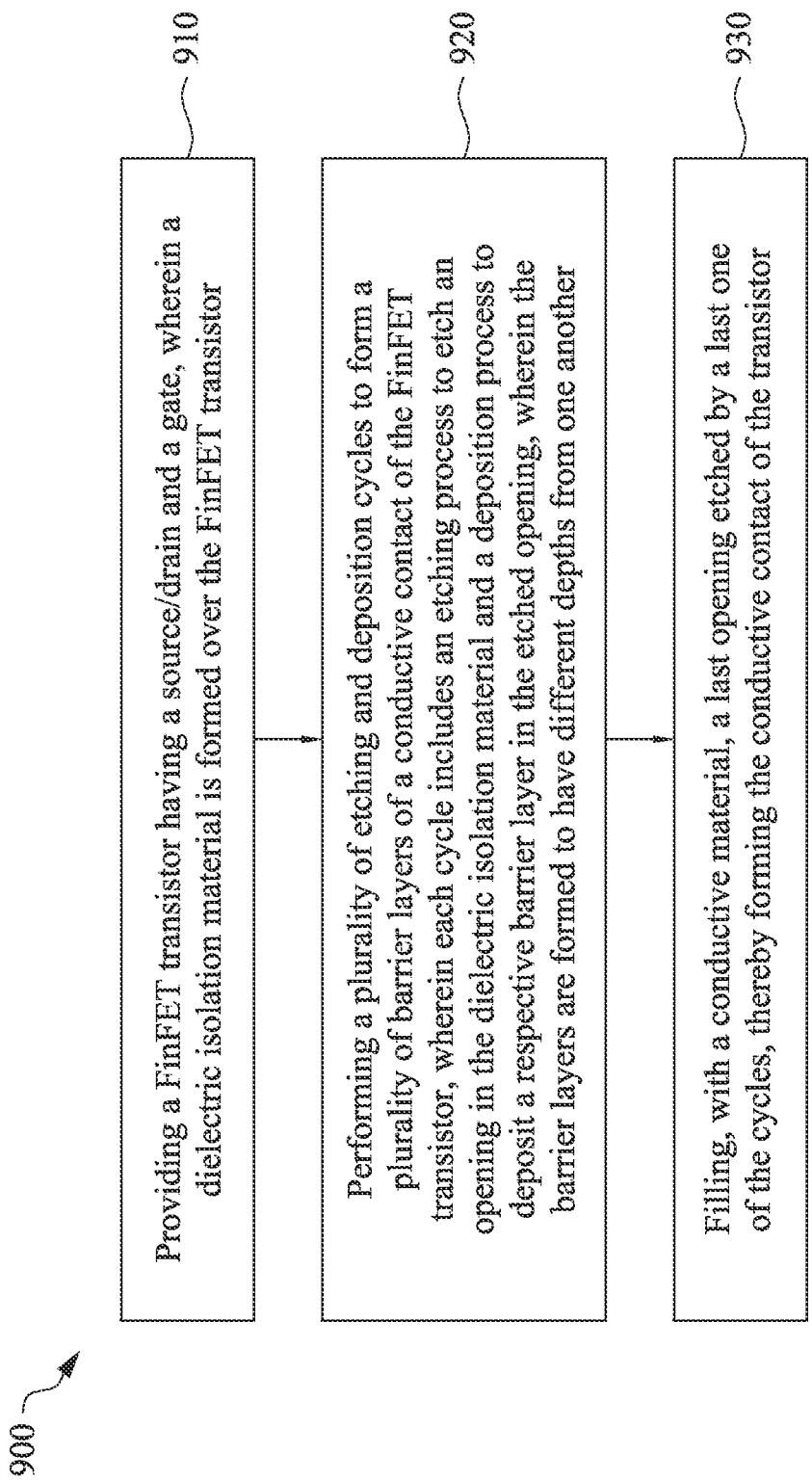

CONDUCTIVE CONTACT HAVING BARRIER LAYERS WITH DIFFERENT DEPTHS

PRIORITY DATA

This application is a continuation of U.S. patent application Ser. No. 16/050,191, filed Jul. 31, 2018, the disclosure of which is hereby incorporated in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

However, conventional semiconductor devices may still have certain drawbacks. For example, a conductive contact may be formed to provide electrical connectivity for active devices such as transistors or passive devices such as resistors, capacitors, inductors etc. To form such a conductive contact, a contact opening may be formed and then filled with a conductive material. However, the contact opening of conventional semiconductor devices is often formed to have a vase-like or oval shape. This shape may lead to difficulties in filling the opening, which may degrade device performance or yield.

Therefore, while existing semiconductor devices and the fabrication thereof have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 16 is a flowchart illustrating a method of fabricating a semiconductor device according to an embodiment of the present disclosure.

DETAILED DESCRIPTION

Figure 1:
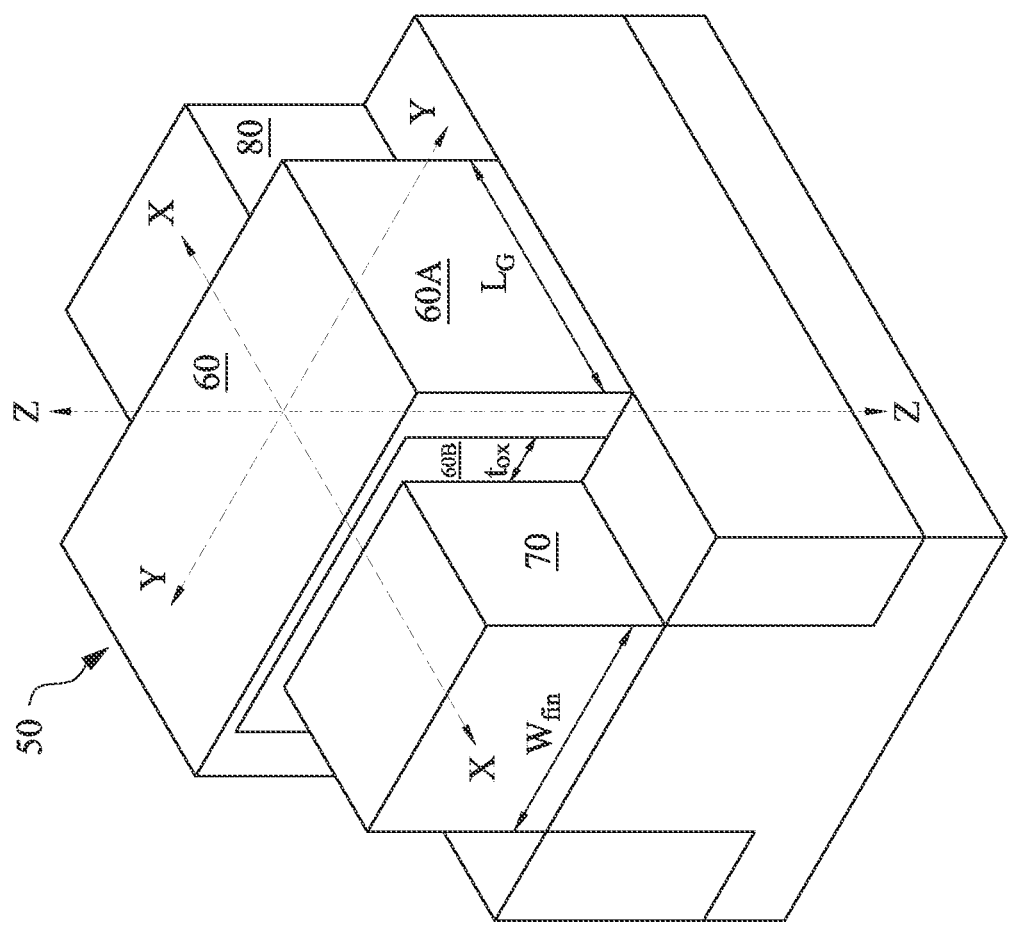
FIG. 1 is a perspective view of an example FinFET transistor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The semiconductor industry has progressed into nanometer technology process nodes in pursuit of higher device density, higher performance, and lower costs However, traditional semiconductor fabrication methods may still have shortcomings. For example, in order to provide electrical connectivity for the semiconductor device, conductive contacts may be formed over the active devices such as transistors or passive devices such as resistors or capacitors. The formation of a conductive contact may include etching a contact opening in a dielectric structure and subsequently filling the opening with a conductive material such as metal. However, the contact opening formed in conventional semiconductor devices may have an oval or vase-like cross-sectional side profile, for example where it is wider in the middle but narrower at the top and/or bottom. Such a profile may lead to difficulties in filling the contact opening with the conductive material. An incomplete filling of the contact hole may degrade device performance or yield.

To improve device performance, the present disclosure forms a conductive contact with multiple barrier layers. The multiple barrier layers are formed by a plurality of etching-deposition cycles, where the contact opening is etched (or extended downward) in each cycle, followed by a deposition of a different one of the barrier layers. In some of these etching-deposition cycles, a sputtering process is also performed to remove a bottom segment of the deposited barrier layer, so as to make the subsequent etching of the contact opening easier. As a result of this unique fabrication process flow, the multiple barrier layers are formed to have a staircase-like profile in a cross-sectional view. The resulting contact opening does not have the vase-like shape but rather has a shape that is wider at the top and narrower at the bottom, thereby making it easier to fill. The various barrier layers may also have different material compositions, which allow them to serve different roles.

The various aspects of the present disclosure are discussed in more detail below with reference to FIGS. 1-14 and 15A-15B. As a non-limiting example to illustrate the various aspects of the present disclosure, a fin-like field-effect transistor (FinFET) device is discussed with reference to FIGS. 1-14 and 15A-15B. However, it is understood that the various aspects of the present disclosure are not limited to any particular type of device, unless specifically claimed otherwise.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

LG denotes a length (or width, depending on the perspective) of the gate 60 measured in the X-direction. The gate 60 may include a gate electrode component 60A and a gate dielectric component 60B. The gate dielectric 60B has a thickness $t_O$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 2:
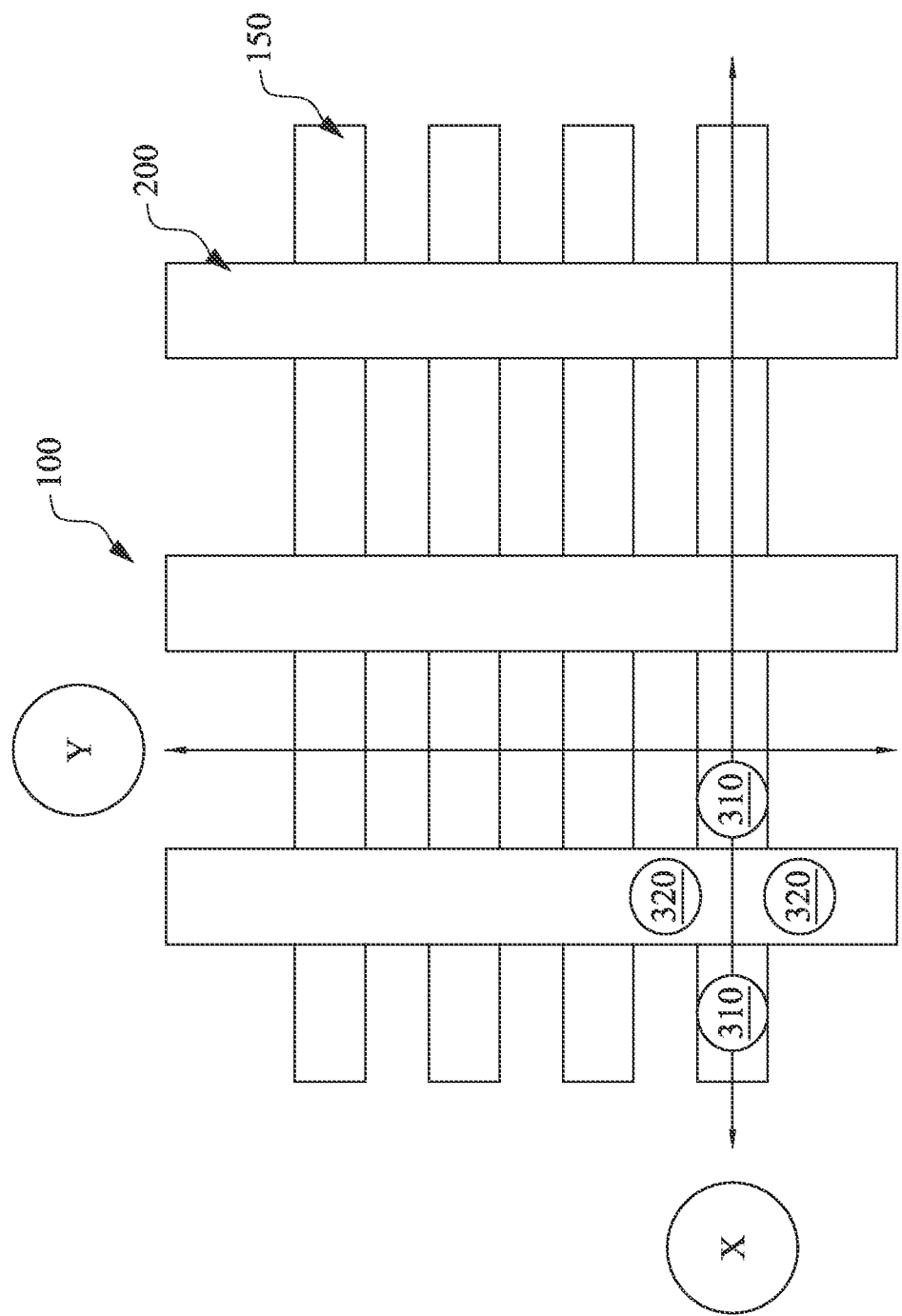
FIG. 2 illustrates a top view of a semiconductor device that includes a plurality of FinFET transistors according to an embodiment of the present disclosure.

FIG. 2 is a simplified top view of a semiconductor device 100, which includes a plurality of FinFET transistors. For reasons of simplicity, the semiconductor device 100 may be interchangeably referred to as a FinFET device 100 hereinafter. As shown in FIG. 2, the semiconductor device 100 includes a plurality of fin structures 150 and a plurality of gate structures 200. The fin structures 150 are portions of the semiconductor layer that protrude upwardly in the Z-direction shown in FIG. 1. The fin structures 150 are elongated structures that each extend in the X-direction of FIG. 1. Meanwhile, the gate structures 200 are elongated structures that each extend in the Y-direction of FIG. 1 and each wrap around a portion of each of the fin structures 150 (e.g., in the manner shown in FIG. 1). In the top view of FIG. 2, the gate structures 200 and the fin structures 150 would appear to intersect perpendicularly.

Different cross-sectional views of the semiconductor device 100 may be obtained by "cutting" it in the X-direction, which is referred to as an X-cut, or by "cutting" it in the Y-direction, which is referred to as a Y-cut. The cross-sectional views of FIGS. 3-12 of the present disclosure are X-cut views unless noted differently otherwise.

Figure 3:
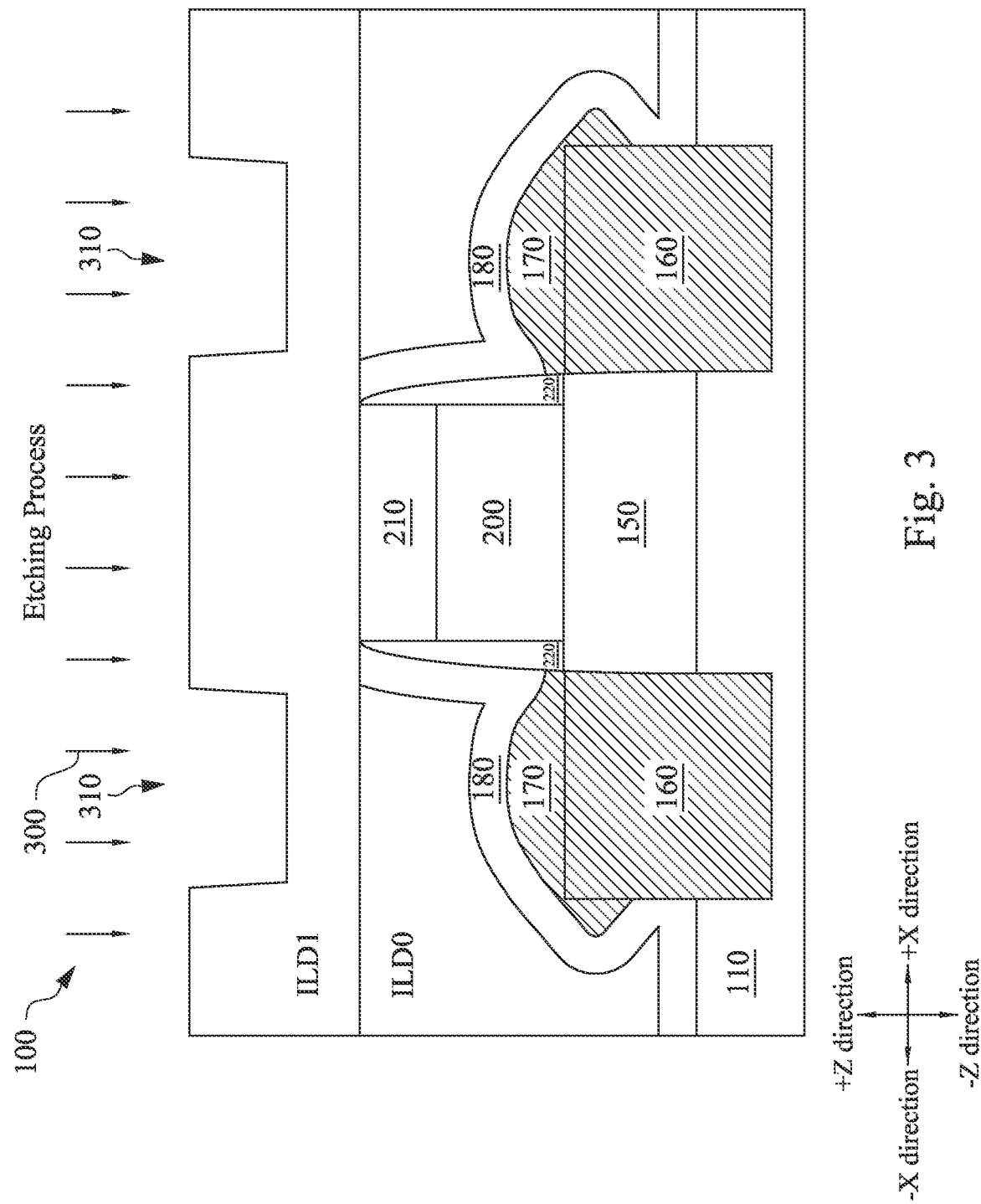
FIGS. 3-14 and 15A-15B illustrate cross-sectional side views of a FinFET transistor at various stages of fabrication according to embodiments of the present disclosure.

Referring to FIG. 3, the semiconductor device 100 is fabricated over a substrate. In some embodiments, the substrate includes a dielectric material, for example silicon oxide ($SiO_2$). In some other embodiments, the substrate includes a semiconductive material, for example silicon. Other suitable materials may also be used for the substrate in alternative embodiments.

The semiconductor device 100 includes a semiconductive layer 110. The semiconductive layer 110 may be formed over the substrate and may include a semiconductive material. For example, in an embodiment, the semiconductive layer 110 includes a crystal silicon material. An implantation process (e.g., an anti-punch-through implantation process) may be performed to implant a plurality of dopant ions to the semiconductive layer 110. The dopant ions may include an n-type material in some embodiments, for example arsenic (As) or phosphorous (P), or they may include a p-type material in some other embodiments, for example boron (B), depending on whether an NMOS (or nFET) or a PMOS (or pFET) is needed.

Isolation structures such as shallow trench isolations (STIs) are formed over the semiconductive layer, though isolation structures may not be directly visible in FIG. 3 due to the location of the X-cut taken herein. The isolation structures may include a dielectric material, such as silicon oxide, silicon nitride, silicon oxynitride, or combinations thereof. The isolation structures provide electrical isolation between various microelectronic components of the semiconductor device 100.

The semiconductor device 100 includes fin structures such as the fin structure 150 that each protrude vertically upwards in the Z-direction. The fin structure 150 may be formed by patterning the semiconductive layer 110 (prior to the formation of the isolation structures). As such, the fin structures 150 may have the same material composition as the semiconductive layer 110. The isolation structures are formed on the sidewalls of the fin structures 150 (again, the isolation structures are not directly visible herein), but portions of the fin structures 150 still protrude out of the isolation structures. In other words, at least a portion of each fin structure 150 is not covered by the isolation structures.

Portions of the fin structure 150 may be doped to serve as source/drain regions 160 of a FinFET transistor. The source/drain regions 160 may include silicon germanium or silicon phosphorous. An epi-layer 170 may also be epitaxially grown on the source/drain regions 160 via one or more epitaxial growth processes. The epi-layer 170 are also considered parts of the source/drain of the FinFET transistor. The portion of the fin structure 150 located between the source/drain regions 160 may serve as the channel region of the FinFET transistor. An etching stop layer 180 is located over the epi-layer 170. In some embodiments, the etching stop layer 180 may include a dielectric material.

The semiconductor device 100 also includes inter-layer dielectric (ILD) structures, for example an ILD0 layer and an ILD1 layer located over the ILD0 layer. The ILD0 layer and the ILD1 layer may include a dielectric material, such as a low-k dielectric material (a dielectric material with a dielectric constant smaller than that of silicon dioxide). As non-limiting examples, the low-k dielectric material may include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or combinations thereof. Alternatively, the ILD0 layer and/or the ILD1 layer may include silicon oxide or silicon nitride, or combinations thereof.

The semiconductor device 100 further includes the gate structure 200. The gate structure 200 is formed to wrap around each of the fin structure 150, for example in a manner similar to what is shown in FIG. 1. The gate structure 200 may include a gate dielectric and a gate electrode. The gate dielectric may include a high-k dielectric material, which is a material having a dielectric constant that is greater than a dielectric constant of $SiO_2$, which is approximately 4. In an embodiment, the high-k gate dielectric includes hafnium oxide (HfO2), which has a dielectric constant that is in a range from approximately 18 to approximately 40. In alternative embodiments, the high-k gate dielectric may include ZrO2, Y2O3, La2O5, Gd2O5, TiO2, Ta2O5, HfErO, HfLaO, HfYO, HfGdO, HfAlO, HfZrO, HfTiO, HfTaO, or SrTiO. The gate electrode may include a metal-containing material. In some embodiments, the metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure. In various embodiments, the fill metal component may contain Aluminum (Al), Tungsten (W), Copper (Cu), or combinations thereof.

A layer 210 is located over the gate structure 200 (or alternatively, the layer 210 may be considered a part of the gate structure 200). In some embodiments, the layer 210 may include a conductive material and may help reduce the electrical resistance of the gate structure 200. Since the layer 210 is aligned with the gate structure 200, the layer 210 may also be referred to as a self-aligned contact (SAC).

Spacers 220 are located on the sidewalls of the gate structure 200 and on the sidewalls of the layer 210. The spacers 220 may be formed by a suitable deposition process followed by an etching process. The spacers 220 may include a dielectric material, for example silicon oxide, silicon nitride, silicon oxynitride, or combinations thereof.

In some embodiments, the gate structure 200 is formed by a gate replacement process. In a gate replacement process, a dummy gate electrode is formed on the high-k dielectric. The dummy gate electrode may include polysilicon, for example. After the formation of the source/drain regions 160 (and their epi-layers 170) as well as the ILD0 layer, the dummy gate electrode is removed using one or more etching processes, therefore leaving an opening in the ILD0 layer in place of the removed dummy gate structure. The opening is then filled with a metal gate material to form the metal gate electrode of the gate structure 200. This is referred to as a gate-last process. In some embodiments, the gate replacement process includes a high-k last process. In the high-k last process, a dummy gate dielectric (such as silicon oxide) is formed first, instead of the high-k gate dielectric. The dummy gate electrode is then formed on the dummy gate dielectric. Both the dummy gate dielectric and the dummy gate electrode may be removed after the formation of the source/drain regions 160 and the ILD0 layer, thereby leaving an opening. A high-k dielectric material is then formed to fill the opening, thereby forming the high-k gate dielectric. The metal gate electrode is then formed on the high-k gate dielectric.

The ILD1 layer may be formed after the formation of the gate structure 200. An etching process 300 is performed to the semiconductor device 100 to etch one or more openings 310 into the ILD1 layer. Although two openings 310 are shown in FIG. 3, it is understood that in some embodiments, the opening 310 can be a trench that overlaps two fin structures. The etching process 300 may include a wet etching process in some embodiments, or a dry etching process in other embodiments, or a combination thereof in yet other embodiments. For example, in some embodiments, the etching process 300 may include performing a dry etching process first, which is then followed by a wet etching process. The openings 310 etched into the ILD1 layer are located above and vertically aligned with the source/drain regions 160 (or the epi-layers 170) of the FinFET transistor. A simplified representation of the openings 310 are also illustrated in the top view of FIG. 2 (superimposed over the source/drain regions of the fin structures 150) as a non-limiting example. The openings 310 may also be referred to as source/drain contact openings.

Similarly, another etching process similar to the etching process 300 may be performed to the semiconductor device 100 to etch opening 320 into the ILD1 layer, but the openings 320 are located above and vertically aligned with the gate structure 200. In other words, the openings 320 are gate contact openings. Due to the location in which the X-cut cross-sectional view is taken, the gate contact openings 320 are not directly visible in the cross-sectional view of FIG. 3, but the simplified representation of these gate contact openings 320 are illustrated in the top view of FIG. 2. It is understood that although FIG. 2 illustrates two source/drain contact openings 310 and two gate contact openings 320, a plurality of other similar contact openings may be etched into the ILD1 layer for the rest of the source/drain regions and gate structures of the semiconductor device 100.

Figure 4:
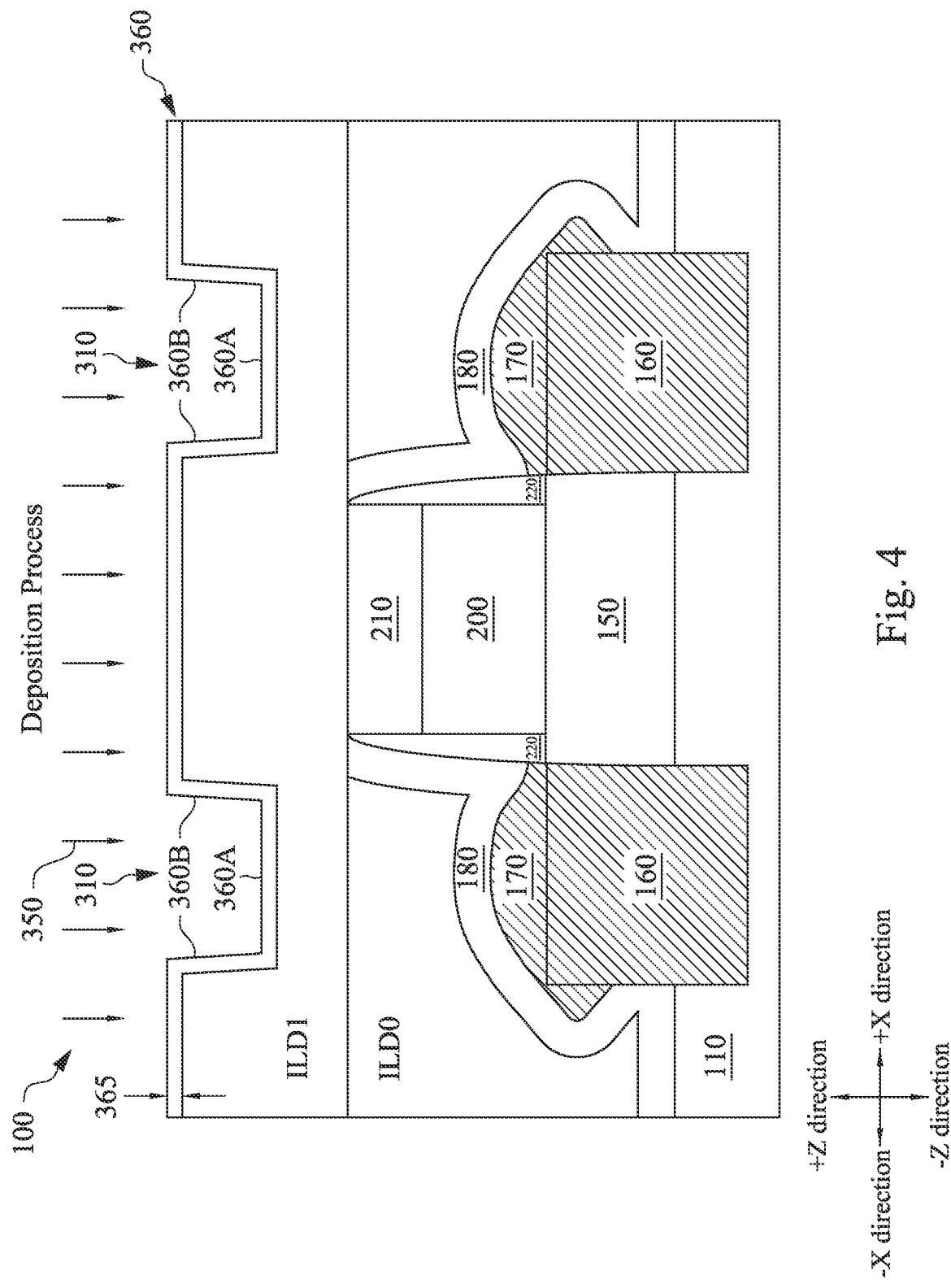

Referring now to FIG. 4, a deposition process 350 is performed to form a barrier layer 360 over the ILD0 layer. In some embodiments, the barrier layer 360 contains TaN, which helps to prevent leakage or diffusion. The barrier layer 360 partially fills in the openings 310 (and the openings 320, though that is not directly visible in FIG. 4). In each opening 310, the barrier layer 360 includes a bottom segment 360A that is formed on a bottom surface of the opening 310, as well as sidewall segments 360B that are formed on the sidewalls of the opening 310. The sidewalls segments 360B are joined together by the bottom segment 360A. The barrier layer 360 is formed to have a thickness 365. In some embodiments, the thickness 365 is in a range between about 10 angstroms and about 500 angstroms.

It is understood that the barrier layer 360 is also deposited into the openings 320 (i.e., the gate contact openings) by the deposition process 350, though the barrier layer 360 formed in the openings 320 is not directly visible in FIG. 4. The barrier layer 360 formed in the gate contact openings 320 also has sidewall segments 360B joined together by a bottom segment 360A. In some embodiments, the deposition process 350 includes a sputtering process in which a target source material (e.g., the material for the barrier layer 360) is eroded (e.g., via ion bombardment) and thus deposited onto the ILD1 layer. In some embodiments, the deposition process 350 is performed using a tool that is capable of performing both DC voltage sputtering and/or AC voltage (RF) sputtering.

Figure 5:
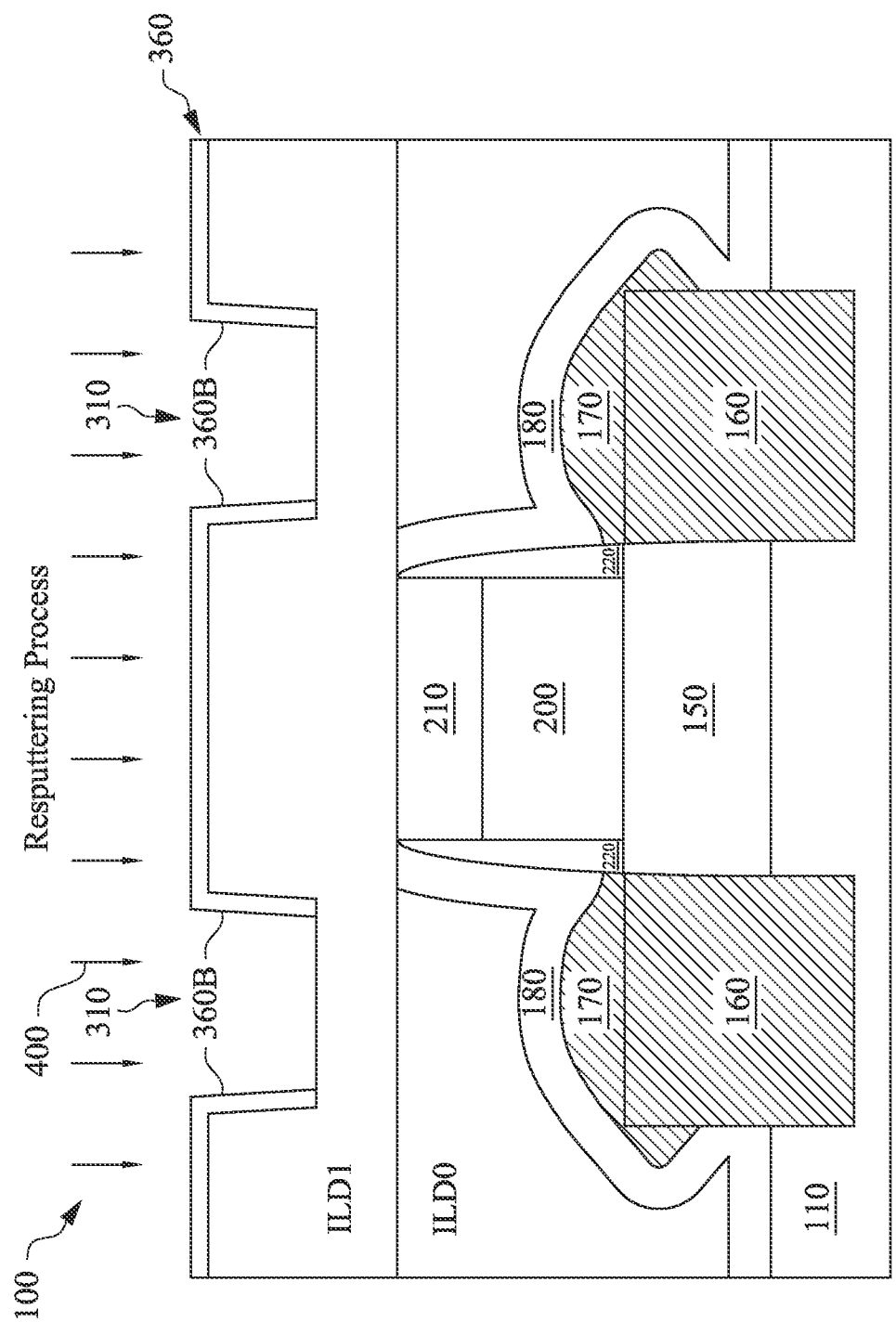

Referring now to FIG. 5, a resputtering process 400 is performed to the semiconductor device 100. The resputtering process 400 removes the bottom segment 360A of the barrier layer 360 in each of the openings 310 (and also the bottom segments of the barrier layer 360 in the openings 320). For example, a configurable capacitor (e.g., configurable capacitance) may be placed under the wafer from which the semiconductor device 100 is fabricated. By configuring the capacitor, the direction of ion bombardment may be controlled or adjusted. Thus, the resputtering process 400 is a directional process, and it may be performed such that the bottom segments 360A of the barrier layer 360 are removed without substantially affecting the sidewall segments 360B of the barrier layer 360.

In some embodiments, the resputtering process 400 and the deposition process 350 are performed using the same tool. In other words, since the same semiconductor fabrication tool is capable of performing both a deposition process and a resputtering process, the wafer on which the semiconductor device 100 is fabricated may undergo both the deposition and resputtering processes in that same fabrication tool, which is convenient and simplifies semiconductor fabrication processing. Nevertheless, it is understood that in alternative embodiments, another etching process may be performed instead of the resputtering process 400 in order to remove the bottom segments 360A of the barrier layer 360. In that case, such an etching process may use an etchant configured to remove the material of the barrier layer 360 (e.g., TaN), whereas the etchant of the etching process 300 may be configured to remove a dielectric material of the ILD1 layer (e.g., silicon oxide).

Figure 6:
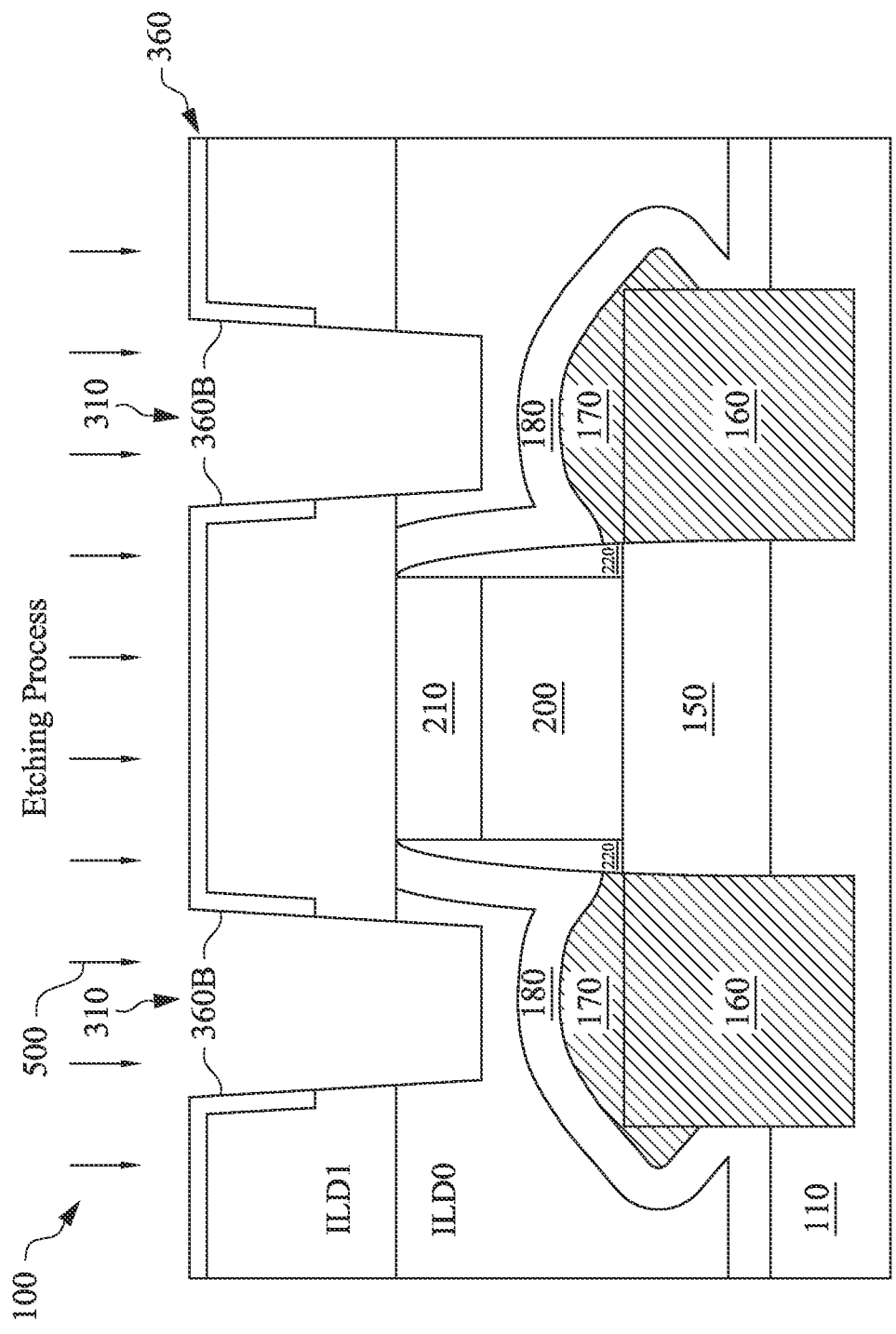

Referring now to FIG. 6, an etching process 500 is performed to the semiconductor device 100 to further extend the openings 310 downward. For example, the openings 310 may be etched through the ILD1 layer and may extend partially into the ILD0 layer. The etching process 500 may also include a dry etching process and/or a wet etching process, for example a dry etching process followed by a wet etching process. The barrier layer 360 may serve as an etching mask during the etching process 500. In some embodiments, a bottom portion of opening 310 is above an upper surface of the etching stop layer 180 (as shown in FIG. 6 herein). In some other embodiments, the opening 310 may extend into the etching stop layer 180. Similarly, another etching process similar to the etching process 500 may be performed to extend the gate contact openings 320 further downward, for example stopping at the layer 210 (or alternatively stopping at the gate structure 200).

Figure 7:
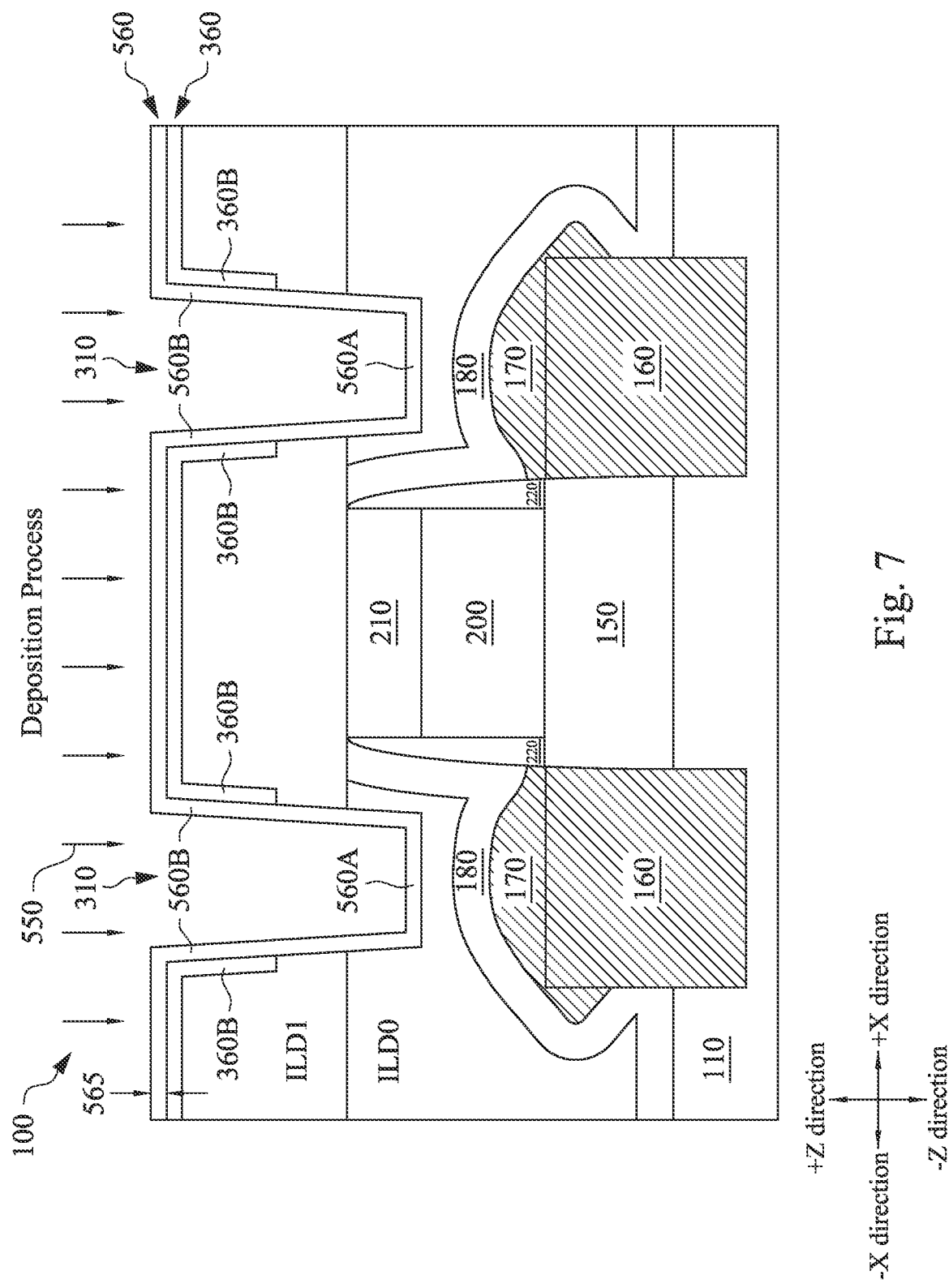

Referring now to FIG. 7, a deposition process 550 is performed to form a barrier layer 560 over the semiconductor device 100. In some embodiments, the barrier layer 560 and the barrier layer 360 may have different material compositions. In some embodiments, the barrier layer 560 contains at least one of TaN, Ta, Ti, TiN, or combinations thereof. These materials help to prevent leakage or diffusion, as well as enhancing electrical conductivity.

As shown in FIG. 7, the barrier layer 560 partially fills in the openings 310. The barrier layer 560 is formed to have a thickness 565. In some embodiments, the thickness 565 is in a range between about 10 angstroms and about 500 angstroms. In each opening 310, the barrier layer 560 includes a bottom segment 560A that is formed on a bottom surface of the opening 310, as well as sidewall segments 560B that are formed on the sidewalls of the opening 310, as well as on the sidewall segments 360B of the barrier layer 360. In other words, an entirety of the remaining sidewall segments 360B of the barrier layer 360 are in direct physical contact with a portion of the sidewall segments 560B of the barrier layer 560. In some embodiments, the sidewall segments 360B are in physical contact with 20%-80% of the portion of the sidewall segments 560B. This range is configured to facilitate the multi-cycle etching and deposition processes of the present disclosure. If the physical contact between the sidewall segments 360B and 560B is too small, then that indicates the sidewall segments 360B are formed too short, and they may not adequately serve their intended purposes. On the other hand, the physical contact between the sidewall segments 360B and 560B is too big, then that indicates the sidewall segments 560B may not be formed long enough (or the sidewall segments 360B are formed too long), and they may not adequately serve their intended purposes either. It is understood that the barrier layer 560 is also deposited into the extended openings 320 (i.e., the gate contact openings) by the deposition process 550, though the portion of the barrier layer 560 formed in the openings 320 is not directly visible in FIG. 7.

Similar to the deposition process 350, the deposition process 550 may also include a sputtering process, which may be performed via the same fabrication tool in which the deposition process 350 is performed.

Figure 8:
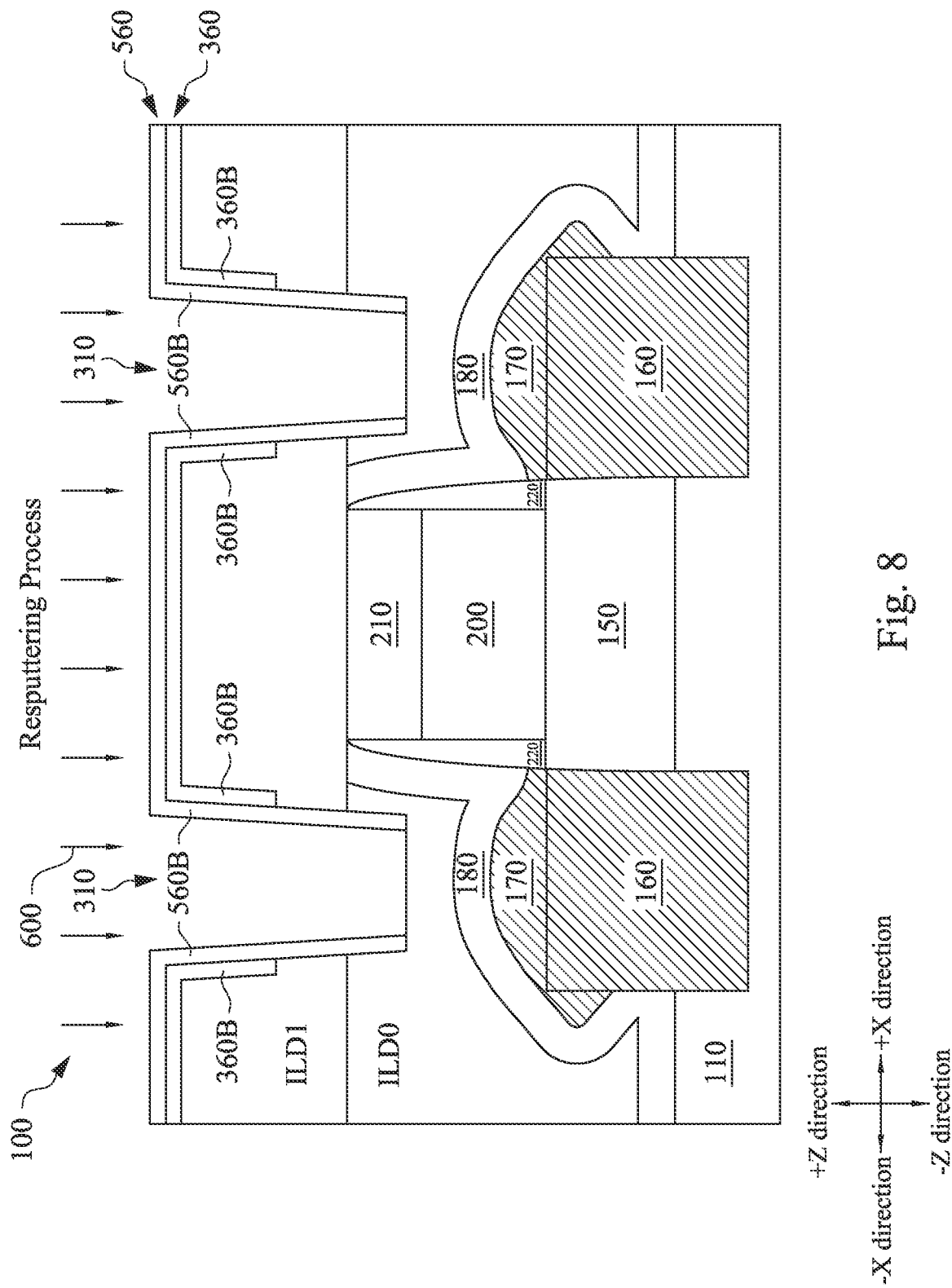

Referring now to FIG. 8, a resputtering process 600 is performed to the semiconductor device 100. The resputtering process 600 removes the bottom segment 560A of the barrier layer 560 in each of the openings 310 (and also the bottom segments of the barrier layer 560 in the openings 320). Again, the resputtering process 600 is a directional process, and it may be performed such that the removal of the bottom segments 560A of the barrier layer 560 does not substantially affect the sidewall segments 560B of the barrier layer 560. It is also understood that the resputtering process 600 may be similar to the resputtering process 400 discussed above and may be performed using the same fabrication tool. In alternative embodiments, instead of the resputtering process, another etching process (e.g., dry etching) may be performed to remove the bottom segments 560A. Such an etching process may be configured to remove the materials of the layer 560 (TaN, Ta, Ti, TiN) without removing a dielectric material of the ILD1 layer (e.g., silicon oxide).

Figure 9:
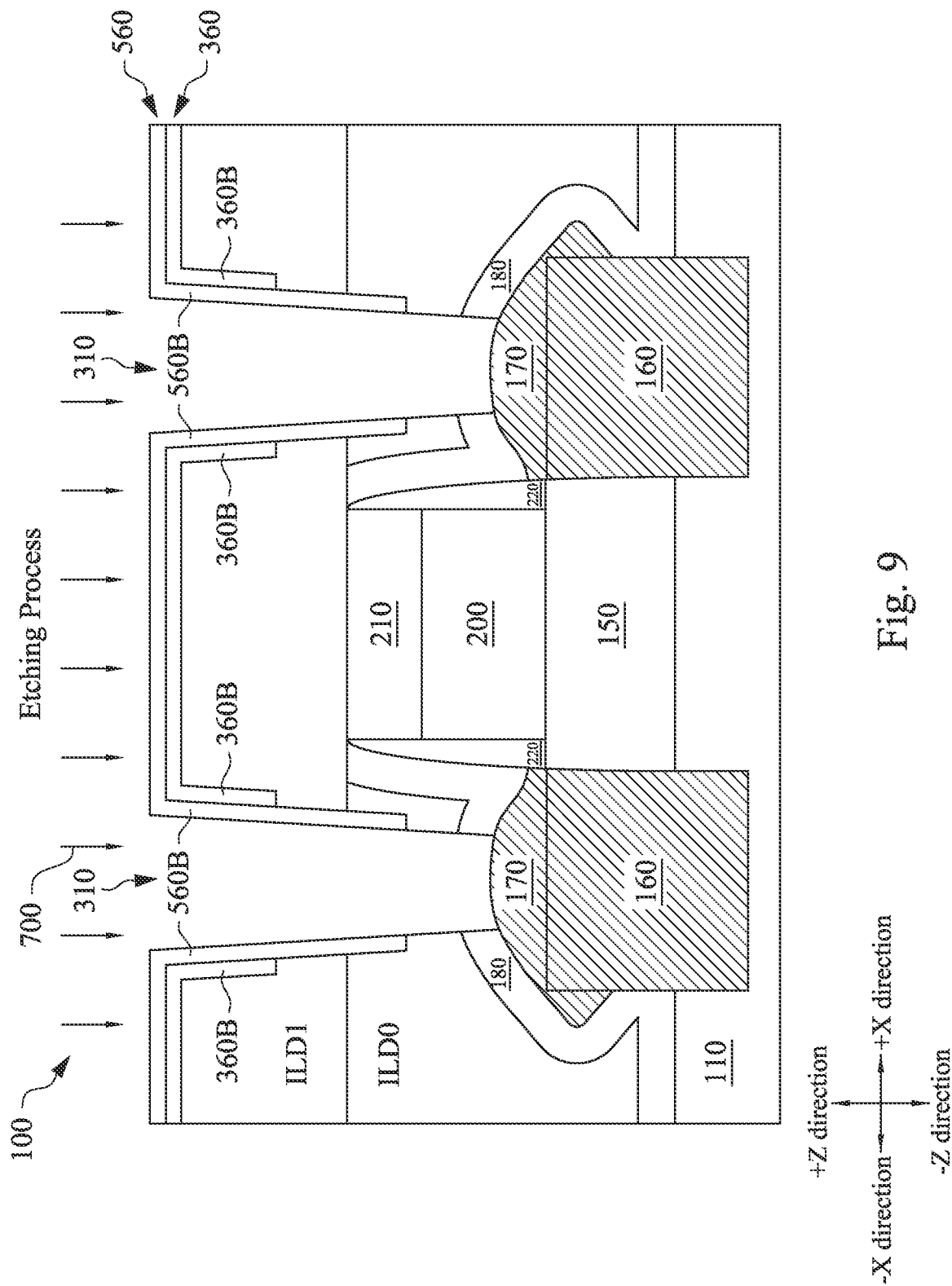

Referring now to FIG. 9, an etching process 700 is performed to the semiconductor device 100 to further extend the openings 310 downward. For example, the openings 310 may be etched through both the ILD1 layer and the ILD0 layer and may extend into the etching stop layer 180, but stops at the epi-layers 170, which as discussed above is considered a part of the source/drain. In some embodiments, the openings 310 may be etched such that a portion of the epi-layers 170 is exposed, which means that the source/drain regions are exposed by the openings 310. The etching process 700 may also include a dry etching process and/or a wet etching process, for example a dry etching process followed by a wet etching process. The barrier layer 560 may serve as an etching mask during the etching process 700.

Figure 10:
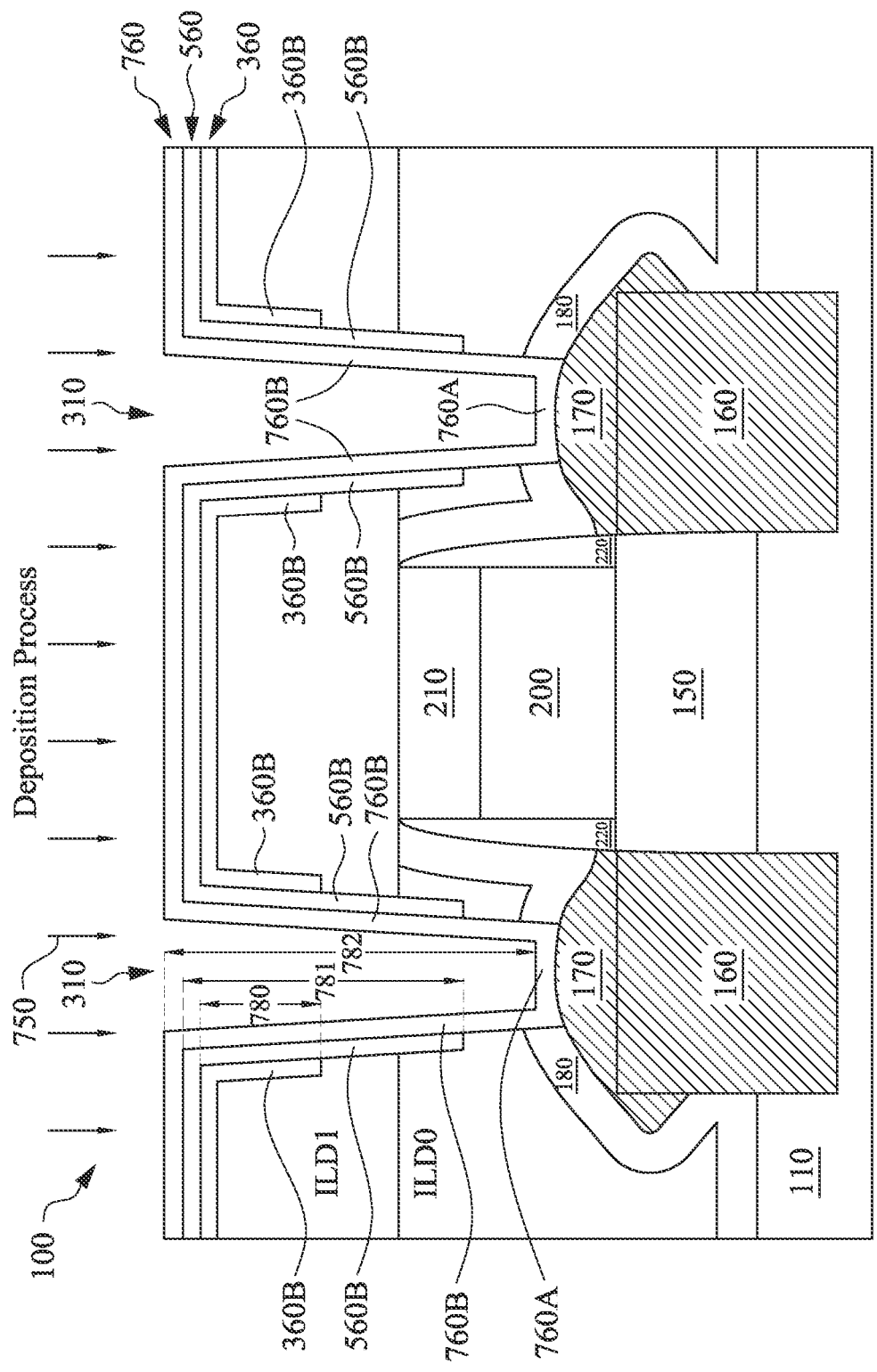
Figure 11:
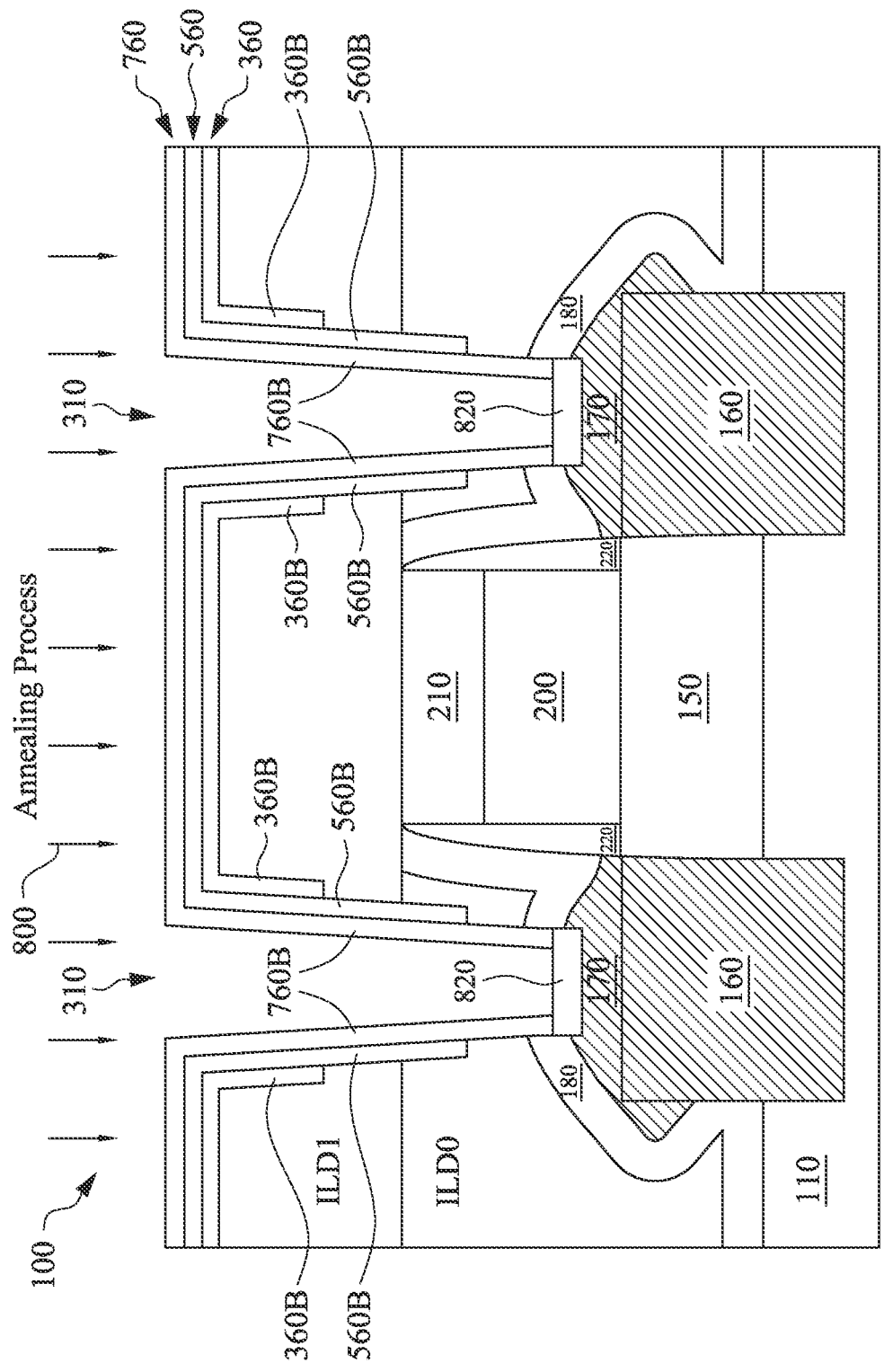

Referring now to FIG. 10, a deposition process 750 is performed to form a barrier layer 760 over the semiconductor device 100. In some embodiments, the barrier layer 760 may be referred to as a glue layer. In some embodiments, the barrier layer 760, the barrier layer 560, and the barrier layer 360 may have different material compositions from one another. In some embodiments, the barrier layer 760 contains Co, Ni, Ti, TiN, or combinations thereof. These materials help to prevent leakage or diffusion, enhancing electrical conductivity, as well as promoting silicide formation.

As shown in FIG. 10, the barrier layer 760 partially fills in the openings 310. In each opening 310, the barrier layer 760 includes a bottom segment 760A that is formed on a bottom surface of the opening 310, as well as sidewall segments 760B that are formed on the sidewalls of the opening 310 and on the sidewall segments 560B of the barrier layer 560. In other words, as a non-limiting example illustrated in the embodiment of FIG. 10, an entirety of the remaining sidewall segments 560B of the barrier layer 560 are in direct physical contact with a portion of the sidewall segments 760B of the barrier layer 760.

As shown in FIG. 10, the sidewall segment 360B may have a depth 780, the sidewall segment 560B may have a depth 781, and the sidewall segment 760B may have a depth 782 (all measured in the Z-direction). The depths 780-782 are lengths of the sidewall segments 360B, 560B, 760B that extend downwardly in the −Z-direction into the ILD0 and ILD1 layers. In some embodiments, a ratio between the depth 780 and the depth 781 is in a range between about 1:5 and about 3:5. In some embodiments, a ratio between the depth 780 and the depth 782 is in a range between about 1:5 and about 3:7. In some embodiments, a ratio between the depth 781 and the depth 782 is in a range between about 1:2 and about 3:4.

Similar to the deposition processes 350 and 550, the deposition process 750 may also include a sputtering process, which may be performed via the same fabrication tool in which the deposition processes 350 and 550 are performed. Unlike for the barrier layers 360 and 560, no resputtering process needs to be performed for the barrier layer 760. In other words, the bottom segment 760A is kept for the barrier layer 760 in the openings 310. This is because the bottom segment 760A will promote the formation of contact silicides. For example, referring now to FIG. 11, an annealing process 800 is performed to the semiconductor device 100. In some embodiments, the annealing process 800 may include a rapid thermal annealing (RTA) process, in which the annealing temperature is ramped up rapidly. The annealing process 800 facilitates a reaction between the epi-layers 170 (which is a part of the source/drain regions) and the bottom segments 760A of the barrier layer 760. As a result, contact silicide layers 820 may be formed in the epi-layer 170. The contact silicide layers 820 help to reduce the electrical resistance for the contacts that will be formed over the source/drain regions 160. In some embodiments, the contact silicide layers 820 may also have larger volumes compared to the contact silicide layers. This may be attributed to the reaction between certain sidewall segments 760B and the layers underneath. In addition, the shape/profile of the opening 310 formed according to the present disclosure allows a greater exposed area of the source/drain for silicide formation. As such, the silicide area is expanded. The larger silicide layers 820 may further reduce the electrical resistance of the contact and enhance its conductivity.

Figure 12:
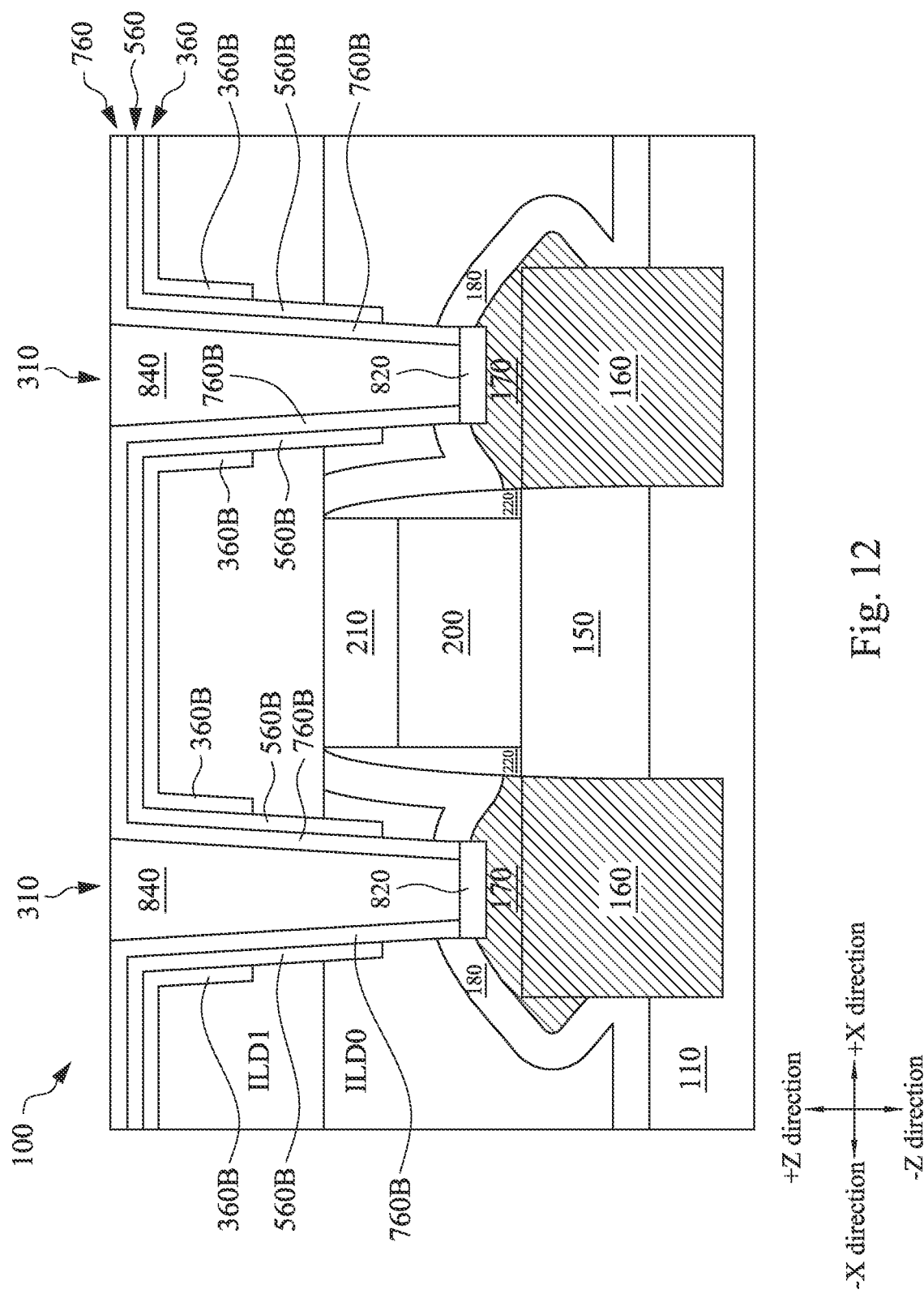

Referring now to FIG. 12, conductive contacts 840 are formed by filling the openings 310 with a conductive material. In some embodiments, the conductive contacts 840 contain a metal, such as Tungsten (W), cobalt (Co), or a combination thereof. It is understood that the barrier layers 360/560/760 may be considered parts of the conductive contacts 840 as well. Though the contacts 840 shown in FIG. 12 are source/drain contacts, it is understood that gate contacts may be formed over the gate structure 200 similarly.

Based on the above discussions, it can be seen that the present disclosure utilizes a unique approach to form the barrier layers 360/560/760 for the contacts 840 of the FinFET transistor. Rather than etching an opening right through the ILD1 and ILD0 layers down to the source/drain regions with a single step, the present disclosure employs a plurality of etching/deposition cycles to define the contact opening 310 and to form the multiple barrier layers. As discussed above with reference to FIGS. 3-10, in each of the etching/deposition cycles, the contact opening 310 is etched downward, followed by a deposition process to deposit a barrier layer in the etched contact opening. The removal of the bottom segments (e.g., the bottom segments 360A and 560A) of the barrier layers using resputtering allows the etching process for the subsequent etching/deposition cycle to continue smoothly, without having to switch the etchant. The remaining portions of the barrier layers also serve as etching masks for the subsequent etching steps, thereby preserving the shape or cross-sectional profile of the contact openings 310. In other words, the contact openings 310 are prevented from having a vase-like profile (common in conventional FinFET devices) where the contact opening is wider in the middle but narrower at the top and bottom. Rather, the contact opening 310 formed by the present disclosure has a profile where it is wider at the top and narrower at the bottom. For example, the lateral width of the contact opening 310 (and thus the subsequently-formed contacts 840 in the opening) may decrease as the depth of the opening increases. This type of profile allows the contacts 840 to be easily formed in the contact openings 310, for example without having gaps therein.

The multiple barrier layers 360/560/760 formed herein also have a unique profile, for example a staircase-like (or echeloned) profile in a cross-sectional side view. For example, a depth (in the Z-direction) of the barrier layer 360 is less than a depth of the barrier layer 560, and a depth of the barrier layer 560 is less than a depth of the barrier layer 760. Alternatively stated, the sidewall segments 760B extend farthest downward, and the sidewall segments 560B extend downward less so, and the sidewall segments 360B extend downward the least, among the three example barrier layers. Another way to describe the unique staircase-like profile of the multiple barrier layers 360/560/760 is that a depth of each of the barrier layers is correlated with a distance of the barrier layer from the contact 840. For example, as the distance between the barrier layer and the contact 840 decreases, the depth of the barrier layer increases.

Due to their different locations and different material compositions, the barrier layers 360/560/760 may also serve different functions. For example, the barrier layer 360 may be mainly used to prevent leakage, for example diffusion between the contacts 840 and the ILD1 layer. The barrier layer 560 may be mainly used to prevent leakage, as well as to enhance the conductivity of the contacts 840. The barrier layer 760 may be used not only to prevent leakage and to enhance the conductivity of the contacts 840, but also to promote contact silicide formation. The barrier layers 360/560/760 also facilitate the adhesion of the contacts 840, since the contacts 840 by themselves may have inadequate adhesion with the ILD0/ILD1 layers. As such, the barrier layers 360/560/760 may also be referred to as glue layers.

Figure 13:
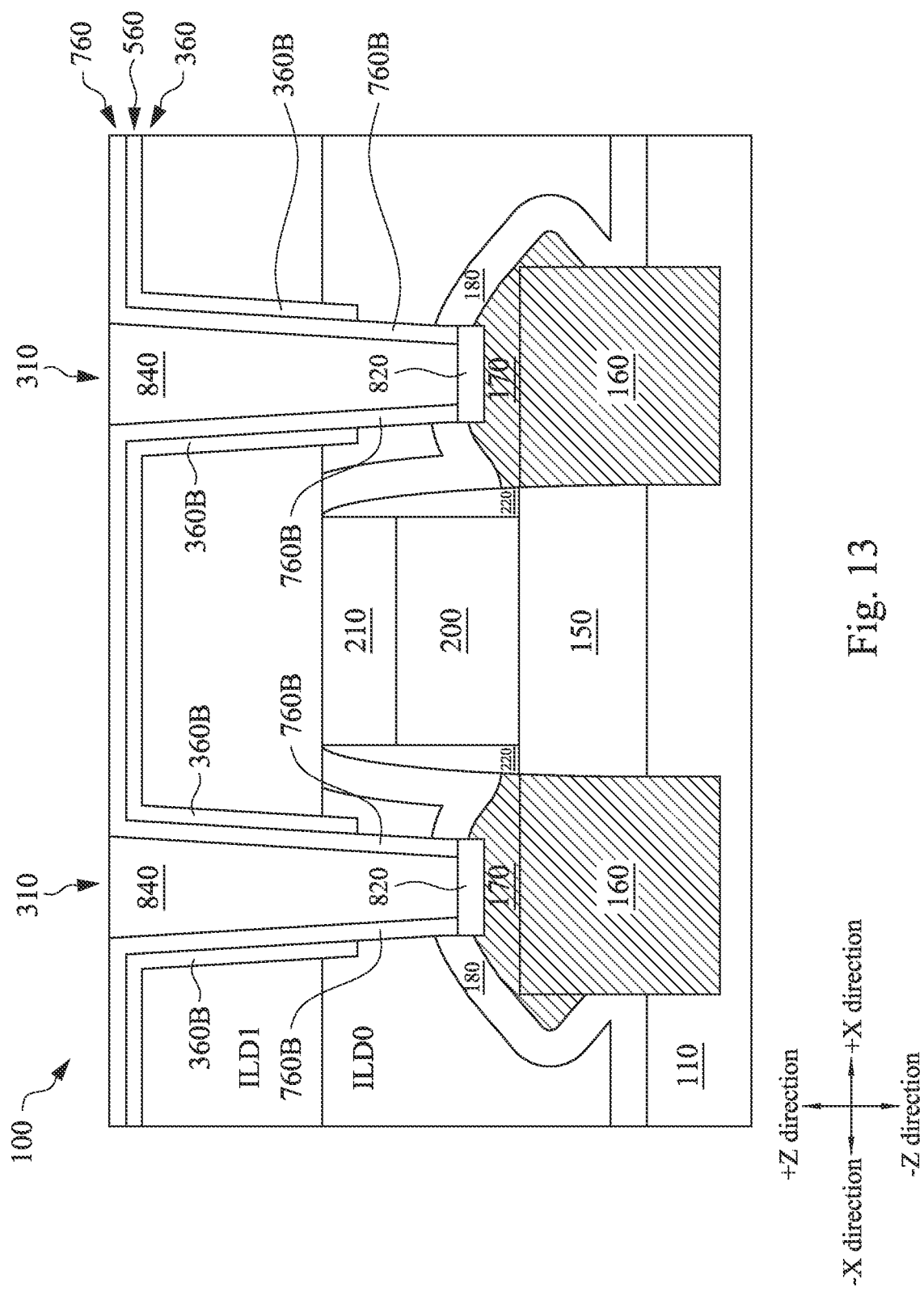
Figure 14:
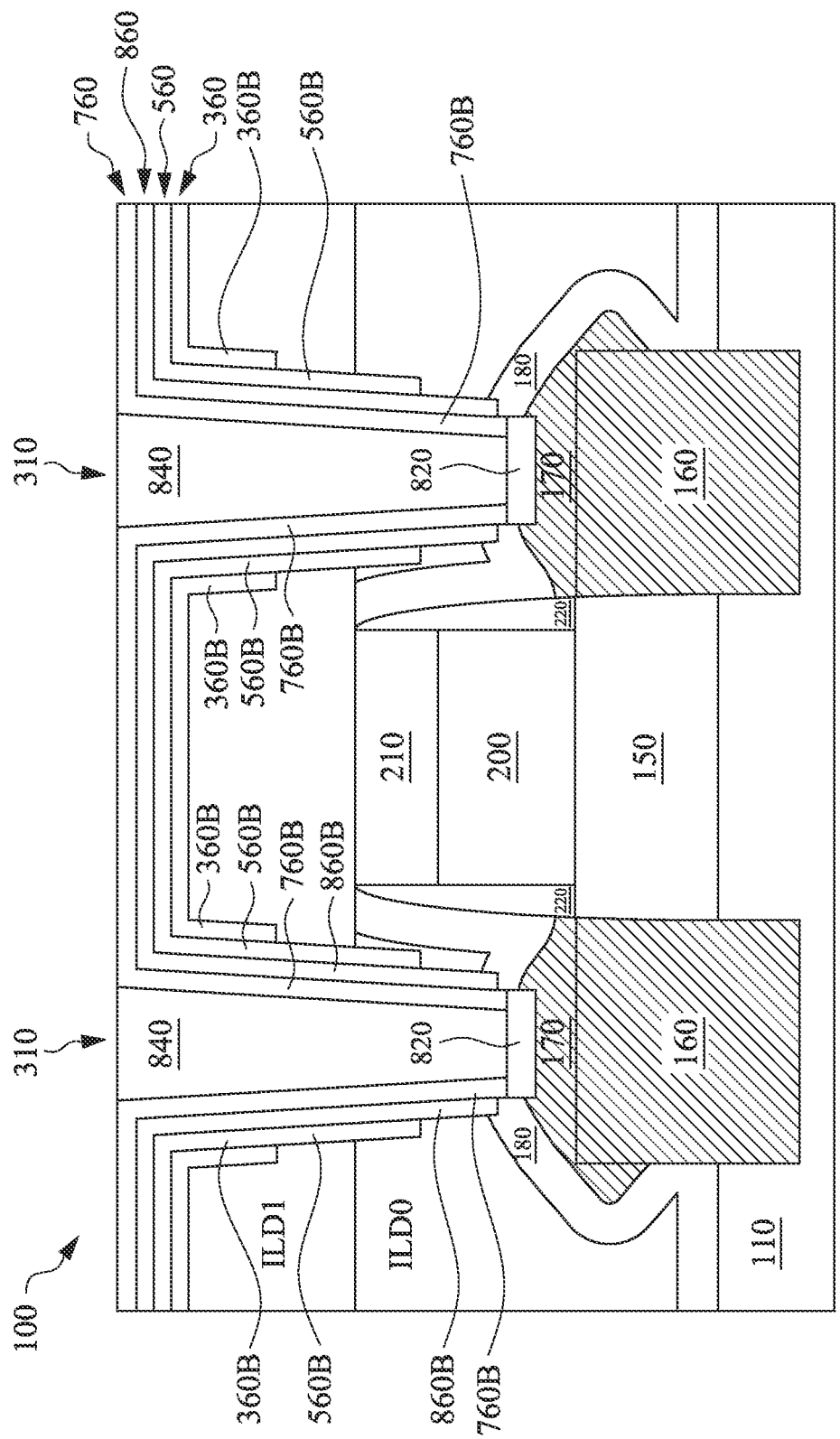

It is understood that although three barrier layers 360/560/760 are used herein to illustrate the concepts of the present disclosure, the number of the barrier layers is not limited to three. In other embodiments, more or less than three barrier layers may be used without departing from the spirit and scope of the present disclosure. For example, FIG. 13 illustrates an alternative embodiment where two barrier layers (e.g., the layers 360 and 760) are implemented, rather than three. In the embodiment illustrated in FIG. 13, the depth of the barrier layer 360 may be greater than the depth 780 but less than the depth 781 (shown in FIG. 10). As another example, FIG. 14 illustrates an alternative embodiment where four barrier layers, such as the layers 360, 560, 760, and 860 are implemented, rather than three. The barrier layer 860 may be implemented between the barrier layers 560 and 760, for example. In the embodiment illustrated in FIG. 14, the depth of the barrier layer 860 (e.g., measured by how far the sidewall segments 860B extend downwards in the Z-direction) may be greater than the depth 781 but less than the depth 782 (shown in FIG. 10). The barrier layer 860 may also have different material compositions than the barrier layers 360, 560, and/or 760.

In addition, the source/drain contacts and the gate contacts may have different number of barrier layers in some embodiments, or the same number of barrier layers in other embodiments.

Figures 15A, 15B:
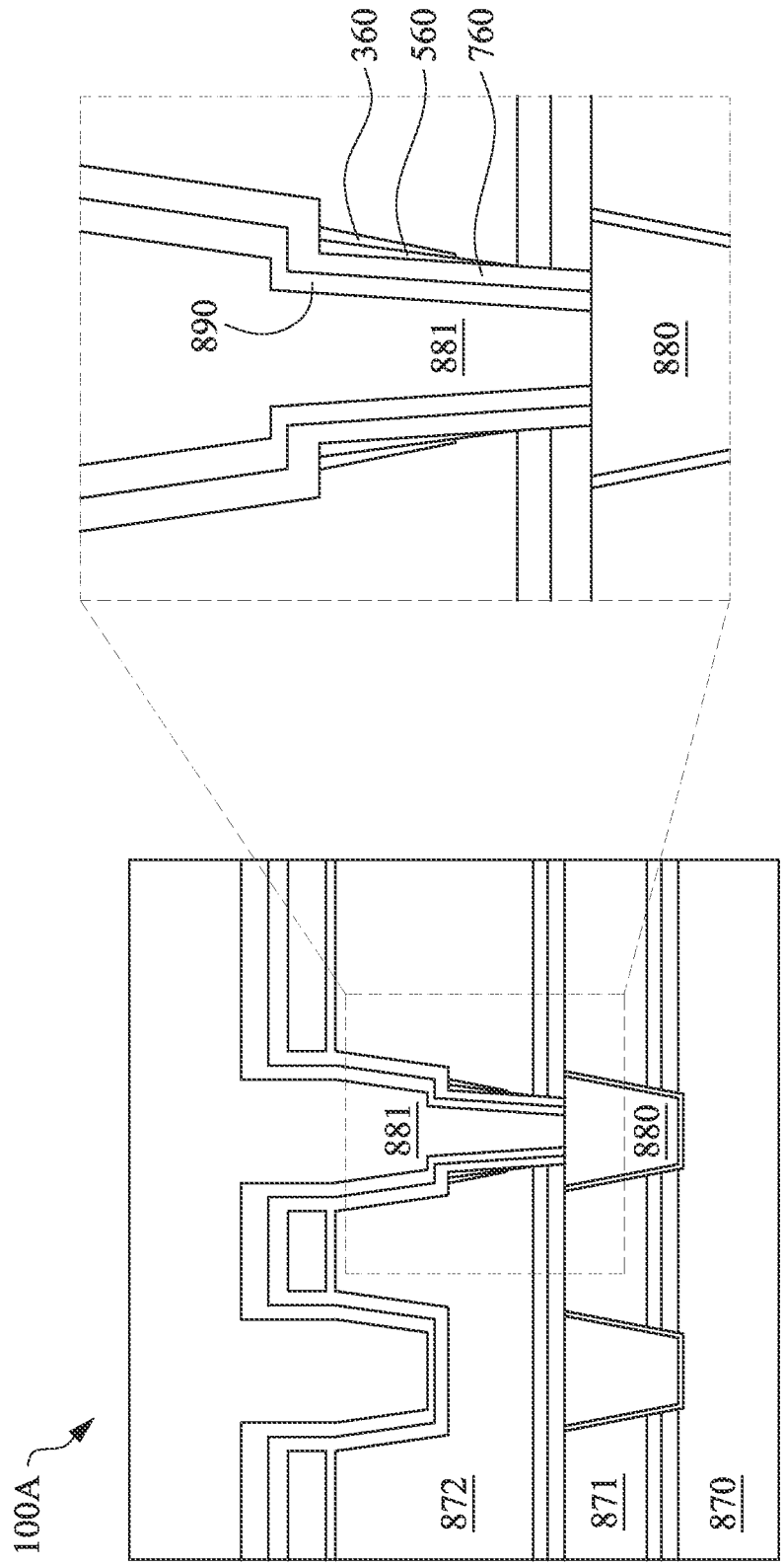

FIGS. 15A-15B illustrate fragmentary cross-sectional side views of a portion of a semiconductor device 100A that is an embodiment of the semiconductor device 100 discussed above. For reasons of clarity and consistency, similar components appearing in FIGS. 3-14 will be labeled the same in FIGS. 15A-15B. Also, FIG. 15B illustrates a magnified (e.g., "zoomed-in") portion of FIG. 15A.

In FIGS. 15A-15B, the semiconductor device 100B includes a plurality of ILD layers such as ILD layers 870, 871, and 872. These ILD layers 870-872 may each be implemented as an embodiment of the ILD0 or the ILD1 layer discussed above. A conductive via 880 is formed in the ILD layer 871, and another conductive via 881 is formed over the conductive via 880. The formation of the conductive via 881 may utilize the multi-cycle etch and deposition processes discussed above, in which multiple barrier layers such as the barrier layers 360, 560, and 760 are formed. A seed layer 890 is then formed over the barrier layer 760, and the conductive via 881 is subsequently formed on the seed layer 890. Therefore, it can be seen that the various aspects of the present disclosure apply not only to the conductive contacts for a gate component or a source/drain component of a transistor, but they also apply to vias used to establish electrical interconnectivity between various microelectronic components in an IC chip.

FIG. 16 is a flowchart illustrating a method 900 according to an embodiment of the present disclosure. The method 900 includes a step 910, in which a FinFET transistor is provided. The FinFET transistor has a source/drain and a gate. A dielectric material is formed over the FinFET transistor. In some embodiments, the dielectric material includes an interlayer dielectric (ILD).

The method 900 includes a step 920, in which a plurality of etching and deposition cycles is performed to form a plurality of barrier layers of a conductive contact of the FinFET transistor. Each cycle includes an etching process to etch an opening in the dielectric material and a deposition process to deposit a respective barrier layer in the etched opening. The barrier layers are formed to have different depths from one another.

The method 900 includes a step 930, in which a conductive material fills in a last opening etched by a last one of the cycles, thereby forming the conductive contact of the transistor.

In some embodiments, at least some of the cycles further include a resputtering process that is performed between the etching process and the deposition process. The resputtering process removes a bottom segment of the deposited barrier layer. In some embodiments, the deposition process and the resputtering process are performed using a same semiconductor fabrication tool.

In some embodiments, the plurality of etching and deposition cycles is performed as follows: a first etching process is performed to etch an opening in the dielectric material. The opening is located over the source/drain or over the gate of the FinFET transistor. Thereafter, a first barrier layer is deposited in the opening. The first barrier layer includes sidewall segments joined by a bottom segment. The bottom segment of the first barrier layer is then removed. After the bottom segment of the first barrier layer is removed, a second etching process is performed to extend the opening downward. After the second etching process is performed, a second barrier layer is deposited in the opening. The second barrier layer includes sidewall segments joined by a bottom segment. Portions of the sidewall segments of the second barrier layer are formed on the sidewall segments of the first barrier layer. Thereafter, the bottom segment of the second barrier layer is removed. After the bottom segment of the second barrier layer is removed, a third etching process is performed to extend the opening further downward. After the third etching process, a third barrier layer is deposited in the opening. The third barrier layer includes sidewall segments joined by a bottom segment. Portions of the sidewall segments of the third barrier layer are formed on the sidewall segments of the second barrier layer. The opening is then filled with a conductive material to form the conductive contact. In some embodiments, an annealing process after the third barrier layer is deposited but before the opening is filled with the conductive material. The annealing process facilitates the reaction between the third barrier layer and the portions of the source/drain below, thereby forming contact silicide layers. In some embodiments, the first barrier layer, the second barrier layer, and the third barrier layer are formed to have different material compositions from one another. For example, in an embodiment, the first barrier layer is formed to contain TaN, the second barrier layer is formed to contain TaN, Ta, Ti, or TiN, and the third barrier layer is formed to contain Co, Ni, Ti, or TiN.

In some embodiments, the opening is filled with a Tungsten-containing material. The Tungsten-containing material may be formed to be in direct physical contact with the sidewall segments and the bottom segment of the third barrier layer.

In some embodiments, an upper portion of the conductive contact is surrounded by (n+1) barrier layers, an center portion is surrounded by n barrier layers, and a bottom portion is surrounded by (n−1) barrier layers, wherein n is a natural number equal to or greater than 2.

It is understood that additional processes may be performed before, during, or after the steps 910-930 of the method 900. For example, the method 900 may include one or more planarization processes. For reasons of simplicity, other additional steps are not discussed herein in detail.

Based on the above discussions, it can be seen that the present disclosure offers advantages over conventional Fin-FET devices. It is understood, however, that other embodiments may offer additional advantages, and not all advantages are necessarily disclosed herein, and that no particular advantage is required for all embodiments. One advantage is that the present disclosure forms a contact opening with a profile that is easy to fill. This is achieved by the multiple cycles of the etching and deposition processes discussed above. Another advantage is that the different barrier layers may serve different purposes, since they may have different material compositions and different locations. Yet another advantage is that the present disclosure improves the silicide formation for the contacts. For example, the last-formed barrier layer may react with the layers underneath to form the contact silicide layers, which may have a larger volume compared to conventional silicide layers. Yet another advantage is that the processes of the present disclosure are easy to implement, for example the barrier layer deposition and the resputtering may be performed in the same fabrication tool. Other advantages include compatibility with existing FinFET fabrication, so the present disclosure does not require additional processing and is therefore easy and cheap to implement.

One aspect of the present disclosure pertains to a semiconductor device. The semiconductor device has a transistor having a source/drain and a gate. The semiconductor device has a conductive contact for the transistor. The conductive contact provides electrical connectivity to the source/drain or the gate of the transistor. The conductive contact includes a plurality of barrier layers. The barrier layers have different depths from one another.

Another aspect of the present disclosure pertains to a semiconductor device. The semiconductor device has a transistor having a source/drain component and a gate component. The semiconductor device has a conductive contact formed over the source/drain component or over the gate component of the transistor. The conductive contact includes a metal portion surrounded by a plurality of barrier layers. A length of each of the barrier layers is correlated with a distance of the barrier layer from the metal portion.

Another aspect of the present disclosure pertains to a method. The method includes a step of providing a transistor having a source/drain and a gate. A dielectric material is formed over the FinFET transistor. The method includes a step of performing a plurality of etching and deposition cycles to form a plurality of barrier layers of a conductive contact of the transistor. Each cycle includes an etching process to etch an opening in the dielectric material and a deposition process to deposit a respective barrier layer in the etched opening. The barrier layers are formed to have different depths from one another. The method includes a step of filling, with a conductive material, a last opening etched by a last one of the cycles, thereby forming the conductive contact of the transistor.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
a metal portion of a conductive contact;
a first barrier layer disposed on a side surface of the metal portion;
a second barrier layer disposed on a portion, but not all, of a side surface of the first barrier layer, wherein a top surface of the metal portion and a top surface of the first barrier layer is located higher than a top surface of the second barrier layer; and
a dielectric layer disposed below at least the second barrier layer, wherein at least the first barrier layer extends into, and is in direct contact with, the dielectric layer.

2. The semiconductor device of claim 1, wherein the metal portion contains tungsten, cobalt, or combinations thereof.

3. The semiconductor device of claim 1, wherein the first barrier layer and the second barrier layer have different material compositions.

4. The semiconductor device of claim 1, wherein the first barrier layer is disposed on entirety of the side surface of the metal portion.

5. The semiconductor device of claim 1, further comprising: a third barrier layer disposed on a portion, but not all, of a side surface of the second barrier layer.

6. The semiconductor device of claim 5, wherein:
the first barrier layer contains cobalt, nickel, titanium, or titanium nitride;
the second barrier layer contains tantalum nitride, tantalum, titanium, or titanium nitride; and
the third barrier layer contain tantalum nitride.

7. The semiconductor device of claim 5, further comprising: a fourth barrier layer disposed on a portion, but not all, of a side surface of the third barrier layer.

8. The semiconductor device of claim 1, further comprising a silicide layer, wherein bottom surfaces of the metal portion and the first barrier layer are in direct contact with the silicide layer.

9. The semiconductor device of claim 8, wherein the dielectric layer comprises an etching stop layer, and wherein the silicide layer and the first barrier layer collectively extend through the etching stop layer.

10. The semiconductor device of claim 1, further comprising: a gate component of a transistor, wherein the metal portion, the first barrier layer, and the second barrier layer are disposed over, and electrically coupled to, the gate component.

11. The semiconductor device of claim 1, further comprising: a source/drain component of a transistor, wherein the metal portion, the first barrier layer, and the second barrier layer are disposed over, and electrically coupled to, the source/drain component.

12. The semiconductor device of claim 1, further comprising: a conductive via, wherein the metal portion, the first barrier layer, and the second barrier layer are disposed over, and electrically coupled to, the conductive via.

13. A semiconductor device, comprising:
a source/drain;
a gate;
a conductive via;
a silicide disposed over the source/drain, or over the gate, or over the conductive via; and
a conductive contact disposed over the silicide, the conductive contact including a metal core, a first barrier layer, and a second barrier layer, wherein:
bottom surfaces of the metal core and the first barrier layer, but not the second barrier layer, are in physical contact with the silicide; and
the first barrier layer is disposed between the metal core and the second barrier layer.

14. The semiconductor device of claim 13, further comprising a third barrier layer, wherein:
the second barrier layer is disposed between the first barrier layer and the third barrier layer; and
the first barrier layer, the second barrier layer, and the third barrier layer have different material compositions.

15. The semiconductor device of claim 14, wherein:
a bottom surface of the second barrier layer is more elevated than a bottom surface of the first barrier layer; and
a bottom surface of the third barrier layer is more elevated than a bottom surface of the second barrier layer.

16. The semiconductor device of claim 14, further comprising a fourth barrier layer, wherein:
the third barrier layer is disposed between the second barrier layer and the fourth barrier layer; and the fourth barrier layer has a more elevated bottom surface than the third barrier layer.

17. The semiconductor device of claim 13, further comprising an etching stop layer that surrounds the silicide, wherein:
the etching stop layer is in direct contact with a portion of a side surface of the first barrier layer; and
the etching stop layer is in direct contact with a portion of a side surface of the second barrier layer and with a bottom surface of the second barrier layer.

18. A semiconductor device, comprising:
a first interlayer dielectric (ILD) disposed over a substrate;
a second ILD disposed over the first ILD; and
a conductive contact that extends vertically through the second ILD and at least partially through the first ILD, wherein the conductive contact includes a metal component, a first barrier layer disposed on a side surface of the metal component, a second barrier layer disposed on a side surface of the first barrier layer, and a third barrier layer disposed on a side surface of the second barrier layer;
wherein:
the first barrier layer is in physical contact with the first ILD but not with the second ILD;
the second barrier layer is in physical contact with both the first ILD and the second ILD; and
the third barrier layer is in physical contact with the second ILD but not with the first ILD.

19. The semiconductor device of claim 18, further comprising a silicide layer, wherein:
bottom surfaces of the metal component and the first barrier layer are in direct contact with the silicide layer;
a bottom surface of the second barrier layer is in direct contact with the first ILD; and
a bottom surface of the third barrier layer is in direct contact with the second ILD.

20. The semiconductor device of claim 18, wherein the first barrier layer, the second barrier layer, and the third barrier layer have different material compositions.

* * * * *